United States Patent [19]
Tsuboi

[11] Patent Number: 5,883,415
[45] Date of Patent: Mar. 16, 1999

[54] CMOS SEMICONDUCTOR DEVICE WITH IMPROVED LAYOUT OF TRANSISTORS NEAR LCD DRIVE TERMINALS

[75] Inventor: Toshihide Tsuboi, Tokyo, Japan

[73] Assignee: NEC Corporation, Tokyo, Japan

[21] Appl. No.: 749,942

[22] Filed: Nov. 14, 1996

[30] Foreign Application Priority Data

Nov. 17, 1995 [JP] Japan .................................. 7-323623

[51] Int. Cl.[6] .................................................. H01L 23/62
[52] U.S. Cl. ............................ 257/355; 257/357; 257/401
[58] Field of Search ................................... 257/369, 372, 257/204, 206, 207, 355, 357, 401, 500, 501, 506

[56] References Cited

U.S. PATENT DOCUMENTS 5,239,197   8/1993   Yamamoto ........................... 257/500

*Primary Examiner*—David B. Hardy
*Attorney, Agent, or Firm*—Foley & Lardner

[57] ABSTRACT

An improved layout of transistors near LCD drive terminals in a CMOS semiconductor device to reduce a chip size without damaging resistances against electrostatic destruction and latch-up. MOSFETs whose sources are connected to neither an electric source nor a ground are selectively arranged between two protective diffusion layers having different polarities, connected to a terminal.

5 Claims, 13 Drawing Sheets

FIG. 2 PRIOR ART
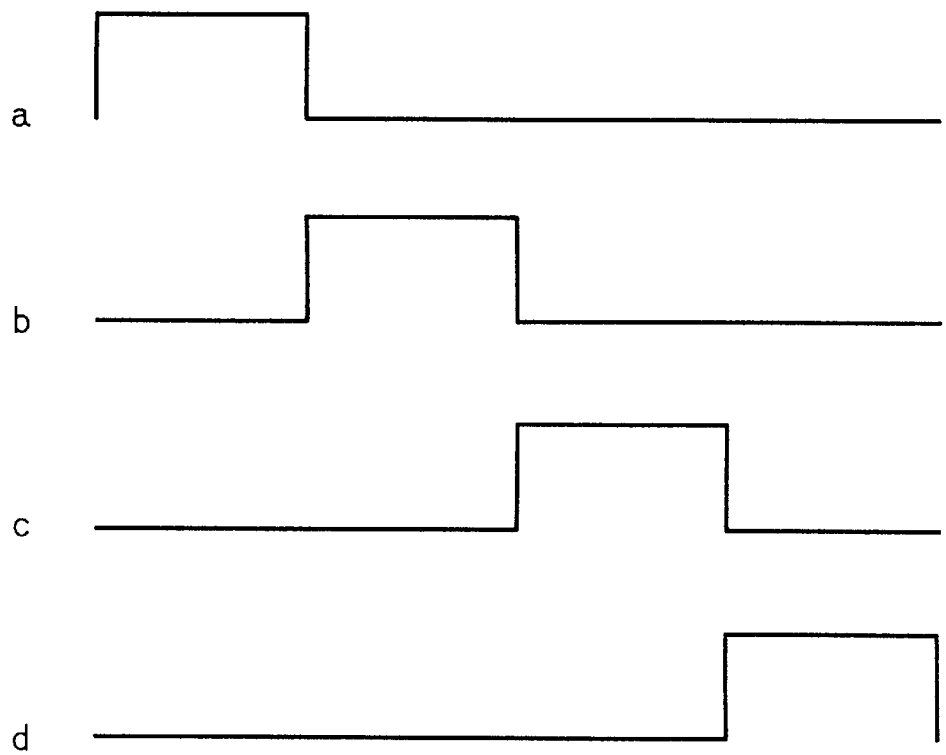
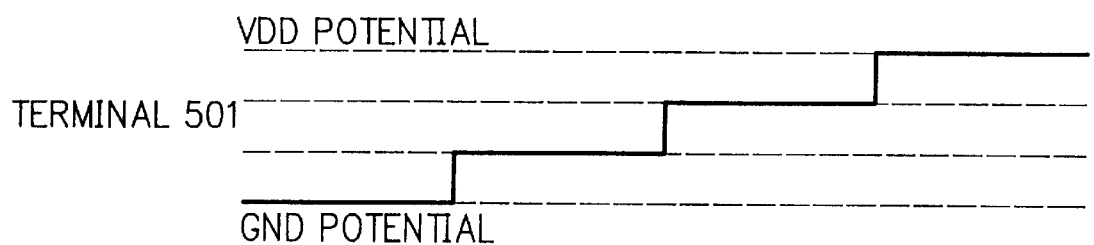

FIG. 7 PRIOR ART

MOSFETS 510~513,515~517

P-TYPE MOSFET —514

N-TYPE MOSFET —519

PAD —541

5,883,415

CMOS SEMICONDUCTOR DEVICE WITH IMPROVED LAYOUT OF TRANSISTORS NEAR LCD DRIVE TERMINALS

BACKGROUND OF THE INVENTION

The present invention relates to a semiconductor device, and more particularly to an improved layout of transistors near LCD (liquid crystal display) drive terminals in a CMOS semiconductor device.

FIG. 1 illustrates a conventional LCD drive terminal circuit. In this LCD drive terminal circuit, as shown in FIG. 1, three resistors 520 are coupled in series between an electric source 502 and a ground terminal 503 so as to divide a source voltage VDD of the electric source 502 to output a ground potential, the ⅓ VDD potential, the ⅔ VDD potential or the VDD potential from an input-output terminal 501. Diode-connected P-type MOSFET 514 and N-type MOSFET 519 are connected at their drains which are linked to the input-output terminal 501. Between the coupling terminals of the three resistors 520 and the input-output terminal 501, a P-type MOSFET 510 of which its gate is input by an inverted signal using an inverter 530 and receiving functions as a pass transistor, a couple of P-type MOSFET 511 and N-type MOSFET 515 receiving at their gates complementary signals using an inverter 531 and which function as a CMOS pass transistor, a couple of P-type MOSFET 512 and N-type MOSFET 516 receiving at their gates by complementary signals using an inverter 532 and which function as a CMOS pass transistor, and an N-type MOSFET 517 functioning as a pass transistor are connected in parallel.

FIG. 2 shows the relationship between input control signals a, b, c and d supplied to the circuit shown in FIG. 1 and potentials output from the input-output terminal 501.

The control signals a, b, c and d are controlled so that one of these signals may be a high level. When the control signal a is high, the N-type MOSFET 517 is "ON" to output the ground signal from the input-output terminal 501. When the control signal b is high, both the P-type MOSFET 512 and N-type MOSFET 516 are "ON" to output the ⅓ VDD signal from the input-output terminal 501. When the control signal c is high, both the P-type MOSFET 511 and N-type MOSFET 515 are "ON" to output the ⅔ VDD signal from the input-output terminal 501. When the control signal d is high, the P-type MOSFET 510 is "ON" to output the VDD signal from the input-output terminal 501.

Various conventional methods are used for driving the LCD, but in general, in order to display many patterns, electrically, a matrix type driver shown in FIG. 3 is used. Lines COM0 to COM3, S0 and S1 are inputs of the LCD and can be driven by the LCD drive terminal circuit shown in FIG. 1.

FIG. 4A and 4B show display patterns of the LCD and are used for displaying numerals. For example, when displaying a numeral "1", patterns 1 and 2 are ON and the rest is OFF. The line S0 is connected to patterns 0 to patterns 3 and the line S1 to patterns 4 to pattern 7, as shown in FIG. 4A. The line COM0 is connected to pattern 0 and pattern 4, the line COM1 to pattern 1 and pattern 5, the line COM2 to pattern 2 and pattern 6, and the line COM3 to pattern 3 and pattern 7, as shown in FIG. 4B.

Voltages shown in FIG. 5 are supplied to the lines COM0 to COM3, S0 and S1. Hence, a large voltage amplitude is applied between COM1 and S0 (see COML-S0 in FIG. 5) and between COM2 and S0 (see COM2-S0 in FIG. 5), and patterns 1 and 2 turn ON.

A voltage amplitude is small between COM0 and S0 and between COM3 and S0, as shown by COMO-S0 and COM3-S0 in FIG. 6, and patterns 0 and 3 are OFF. Similarly, a voltage amplitude is small between COM0 to 3 and S1, and patterns 4 to 7 are OFF.

FIG. 7 schematically shows one example of LCD drive terminals of the circuit shown in FIG. 1. The P-type MOSFET 514 and the N-type MOSFET 519 act as protective elements against electrostatic destruction.

FIG. 8 shows the detailed layout and wiring of the LCD drive terminals shown in FIG. 7.

In FIG. 8, a P-type diffusion layer 601 provides the source and the drain of the P-type MOSFET 514, and polysilicon 604 provides the gate of the same. A second aluminum (A1) 607 is a wire for supplying a source potential to the source and the gate of the P-type MOSFET 514.

An N-type diffusion layer 602 provides the source and the drain of the N-type MOSFET 519, and a polysilicon 603 provides the gate of the same. Another second aluminum 606 is a wire for supplying a ground potential to the source of the N-type MOSFET 519.

A first aluminum 609 couples the drains of the P-type MOSFET 514 and the N-type MOSFET 519, the drains of the P-type MOSFETs 510 to 512 and the drains of the N-type MOSFETs 515 to 517 to a pad 541 corresponding to the input-output terminal 501.

As is well-known, in general, destruction due to static electricity is liable to occur in a MOS type IC. For example, as shown in FIG. 9, when high static electricity is applied to an input-output terminal, a current flows in a PN junction connected to this terminal to destroy the PN junction, or dielectric breakdown occurs in a gate formed by a thin oxide film.

In order to reduce such destruction or breakdown due to static electricity, usually, large size protective elements such as the N-type MOSFET 519 and the P-type MOSFET 514, as shown in FIG. 7, are mounted on the input-output terminal of the MOS type IC to diminish a current density caused when the static electricity is applied to the input-output terminal, resulting in preventing destruction or breakdown.

An LSI using both a P-type MOSFET and an N-type MOSFET is called a CMOS LSI which involves a problem usually called "latch-up".

This latch-up is a phenomenon of current flow in a parasitic thyristor annexed to a CMOS structure and may bring about destruction of a chip at the worst.

FIG. 10 shows a parasitic thyristor. A parasitic thyristor of a PNPN structure is formed between an electric source and a ground. When a latch-up is caused in this part, a large current flows between the electric source and the ground shown in FIG. 10.

The latch-up happens most frequently in a CMOS semiconductor device when higher voltage than the source voltage or a lower voltage than the ground voltage, that is, an overvoltage is applied to the input-output terminal.

As shown in FIG. 11, usually, some P-type or N-type diffusion layer is connected to the input-output terminal 501. For example, when a lower voltage than the ground voltage is applied to the input-output terminal 501, the PN junction between the drain of the N-type MOSFET 519 connected to the input-output terminal 501 and a P-type substrate coupled to the ground has a forward bias and a large current flows therein.

A part of the large current flowing in the P-type substrate reaches a parasitic thyristor shown in FIG. 10, which is positioned near the terminal part of the CMOS type IC shown in FIG. 11.

In the parasitic thyristor shown in FIG. 10, the P-type substrate provides the gate of the thyristor, and, when it is sufficient for the reached current to allow the thyristor to be conductive, the parasitic thyristor becomes conductive and turns to latch-up.

Since this latch-up may bring about the destruction of the chip, the chip is designed so that the latch-up phenomenon is prevented as far as possible. Usually, the P-type and N-type diffusion layers connected directly to the input-output terminal, in particular, are separated from other P-type and N-type diffusion layers at a predetermined distance. As described above, when an overvoltage is applied to the input-output terminal, the P-type and N-type diffusion layers connected directly to the input-output terminal can act as escape paths for the current which causes the latch-up and hence can prevent the sufficient current from reaching the parasitic thyristor causing its conductive state and latch-up.

In the circuit shown in FIG. 7, in order to prevent the latch-up, a predetermined distance is given between the N-type MOSFET 519 and the P-type MOSFET 514, and between the P-type MOSFET 514 and the P-type and N-type MOSFETs 510 to 513 and 515 to 517.

In a semiconductor device for implementing the LCD drive function, usually, the LCD includes many display elements and thus the number of drive terminals also increases.

In the foregoing conventional LCD drive terminal circuit, sufficient space is ensured around each of the many LCD drive terminals for preventing the latch-up. As a result, the chip size is enlarged and the production cost increases.

SUMMARY OF THE INVENTION

It is therefore an object of the present invention to provide an improved layout of transistors near LCD drive terminals in a CMOS semiconductor device in view of the aforementioned disadvantages of the prior art, which is capable of reducing a chip size without damaging resistance against electrostatic destruction and latch-up.

In accordance with one aspect of the present invention, there is provided a semiconductor device, comprising an N-type MOSFET whose drain is connected to an external input-output terminal and whose gate and source are connected to a ground; a P-type MOSFET whose drain is connected to the external input-output terminal and whose gate and source are connected to an electric source; and at least one MOSFET whose source and drain are connected to neither the electric source nor the ground, arranged between the N-type MOSFET and the P-type MOSFET.

That is, according to the present invention, at least one MOSFET connected to neither an electric source nor a ground is arranged between a first protective diffusion layer having a first conductivity type, connected to a terminal and a second protective diffusion layer having a second conductivity type different from the first conductivity type, connected to the terminal, and in particular, for example, in a semiconductor device such as an LCD drive terminal circuit, a chip size can be reduced without damaging resistances against electrostatic destruction and latch-up.

BRIEF DESCRIPTION OF THE DRAWINGS

The objects, features and advantages of the present invention will become more apparent from the consideration of the following detailed description, taken in conjunction with the accompanying drawings, in which:

FIG. 2 is a schematic diagram showing the relationship between input control signals a, b, c and d supplied to the circuit shown in FIG. 1 and potentials output from an input-output terminal;

FIG. 7 is a schematic diagram showing a layout of LCD drive terminals of a conventional semiconductor device;

DESCRIPTION OF THE PREFERRED EMBODIMENTS

Figure 12:
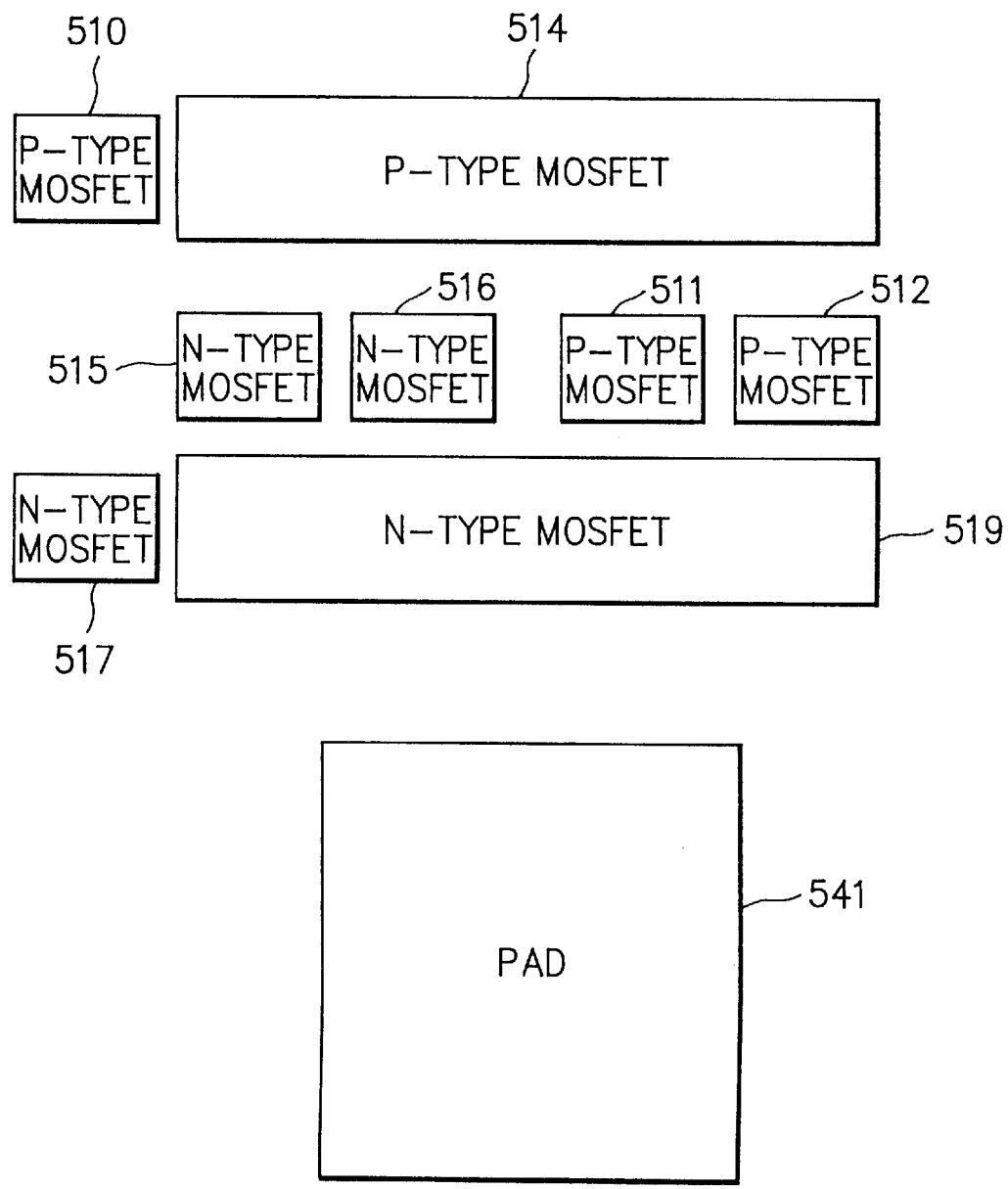
FIG. 12 is a schematic diagram of a layout of transistors near LCD drive terminals in a CMOS semiconductor device according to one embodiment of the present invention.

Referring now to the drawings, there is shown an improved layout of transistors near LCD drive terminals in a CMOS semiconductor device according to one embodiment of the present invention in FIG. 12. The circuit is the same as the conventional one shown in FIG. 1.

Figure 1:
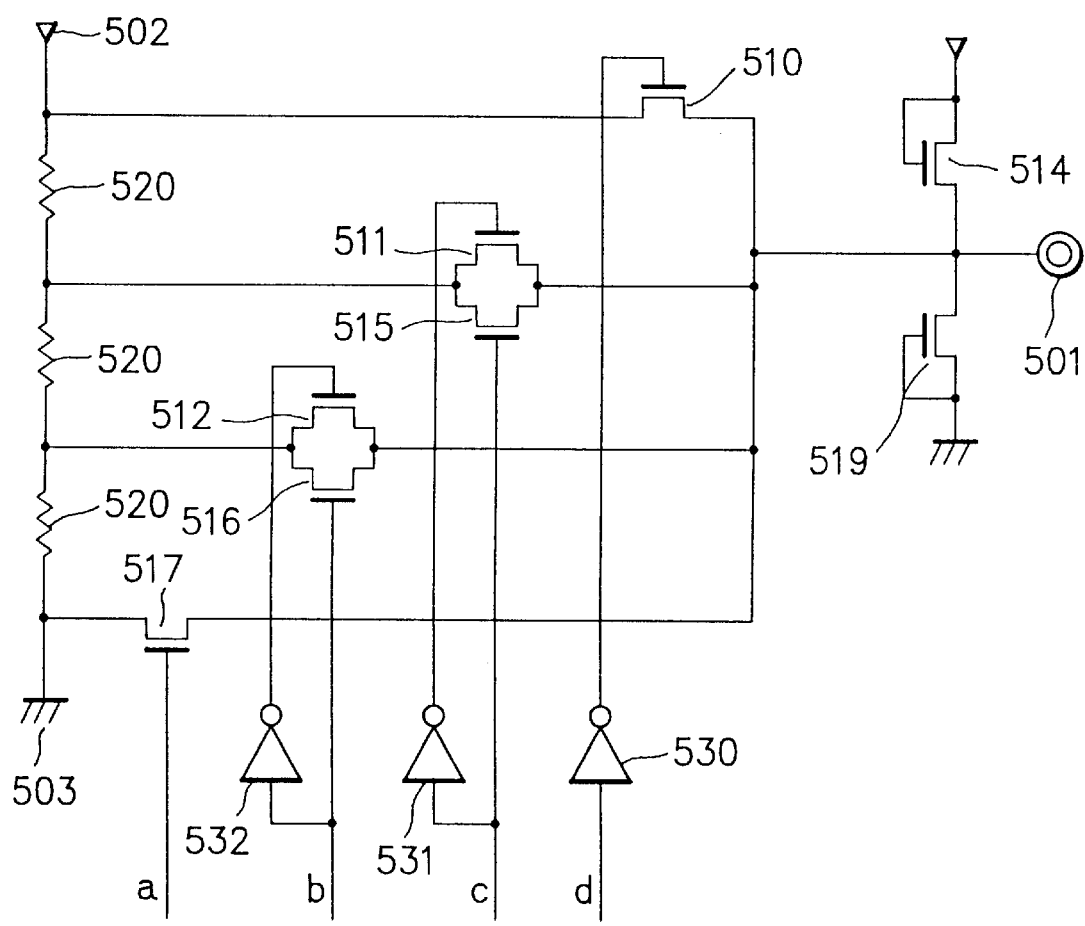
FIG. 1 is a circuit diagram of a conventional LCD drive terminal circuit.
Figure 3:
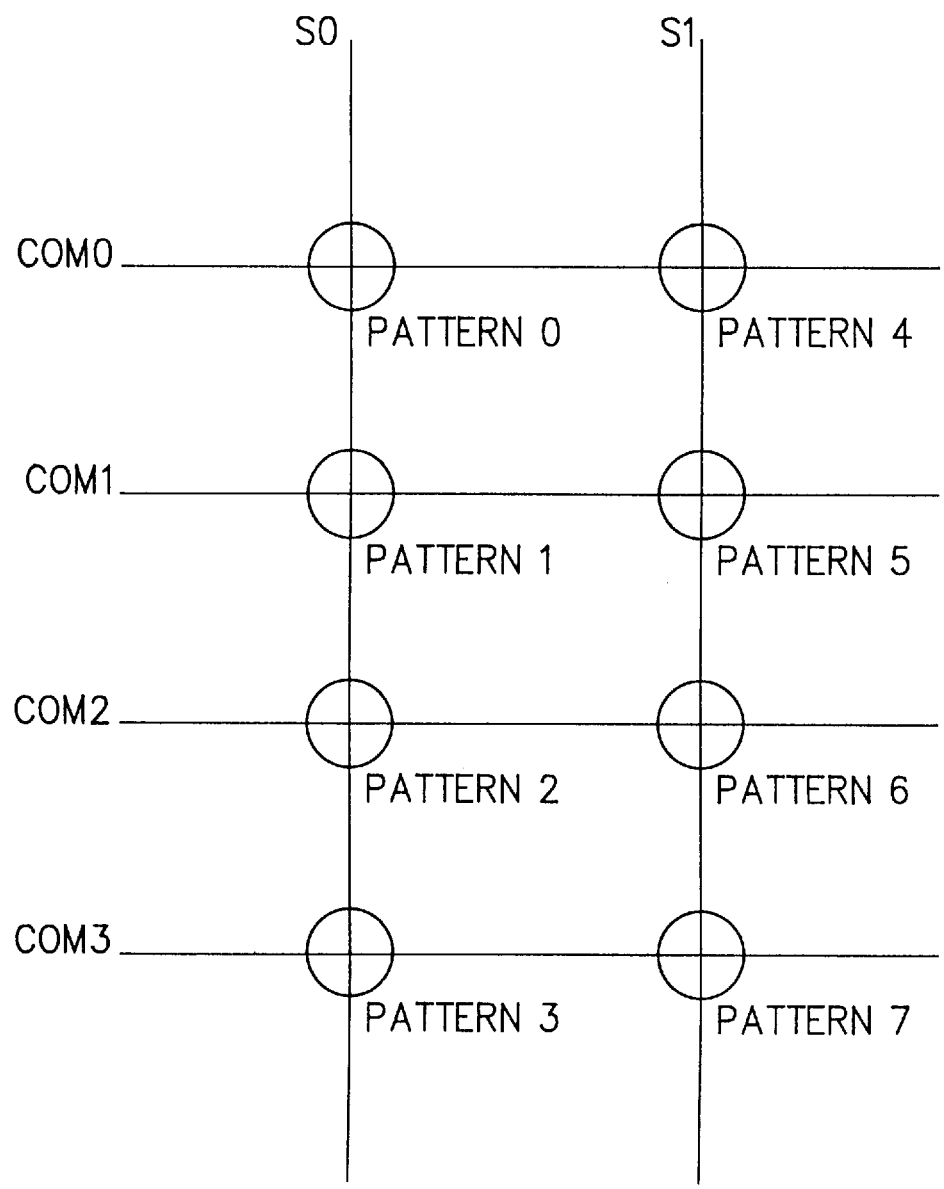
FIG. 3 is a schematic diagram showing a matrix type driver coupled to lines in the LCD drive terminal circuit shown in FIG. 1.
Figure 4A:
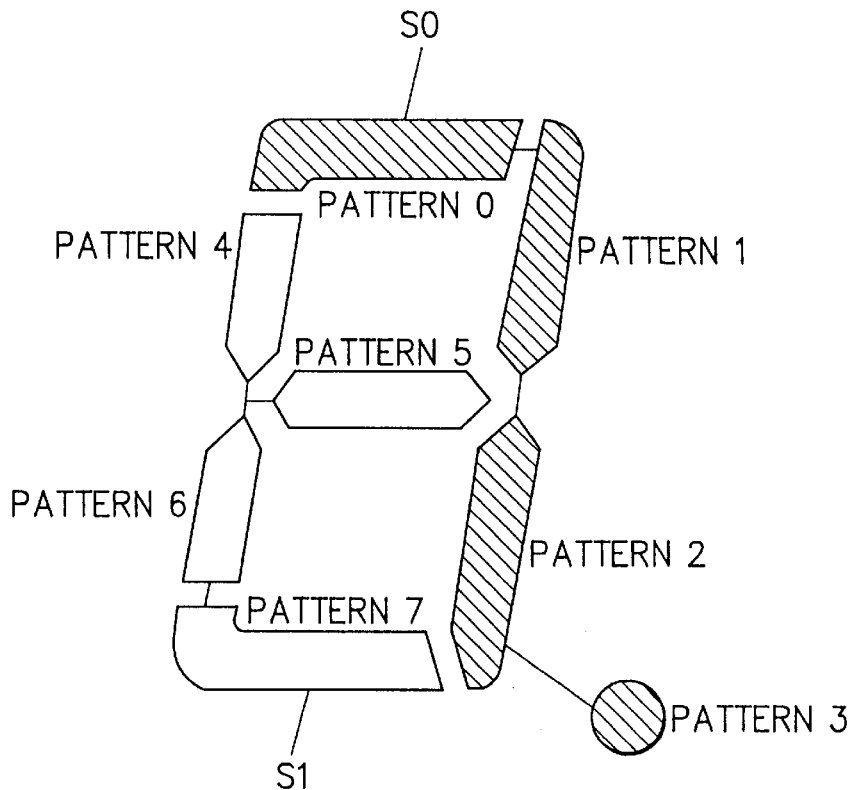
FIG. 4A and 4B are schematic views showing a connection of pattern parts of display parts in the LCD.
Figure 4B:
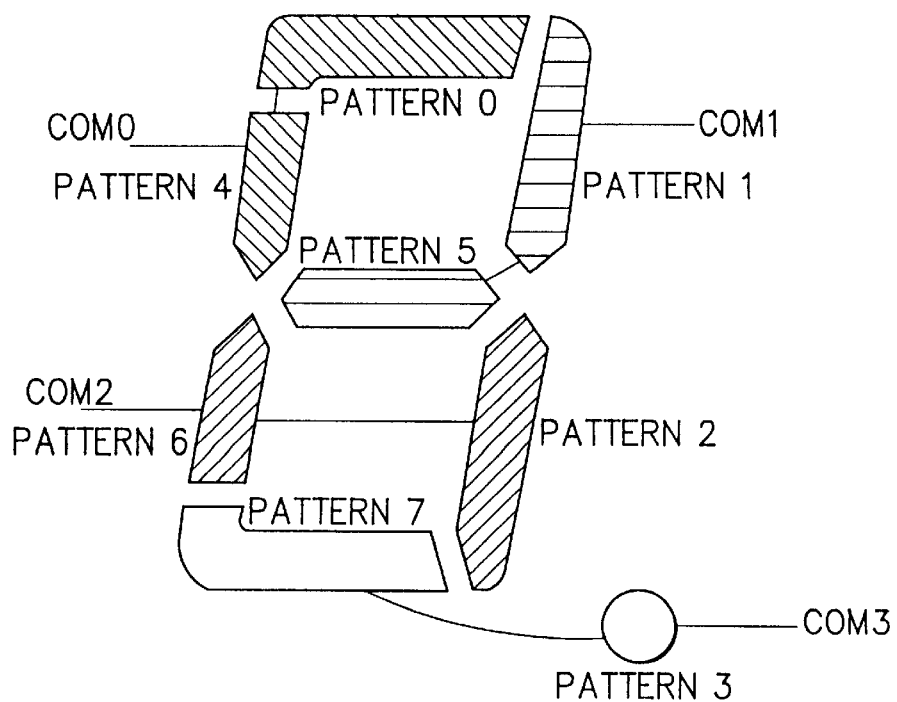
Figure 5:
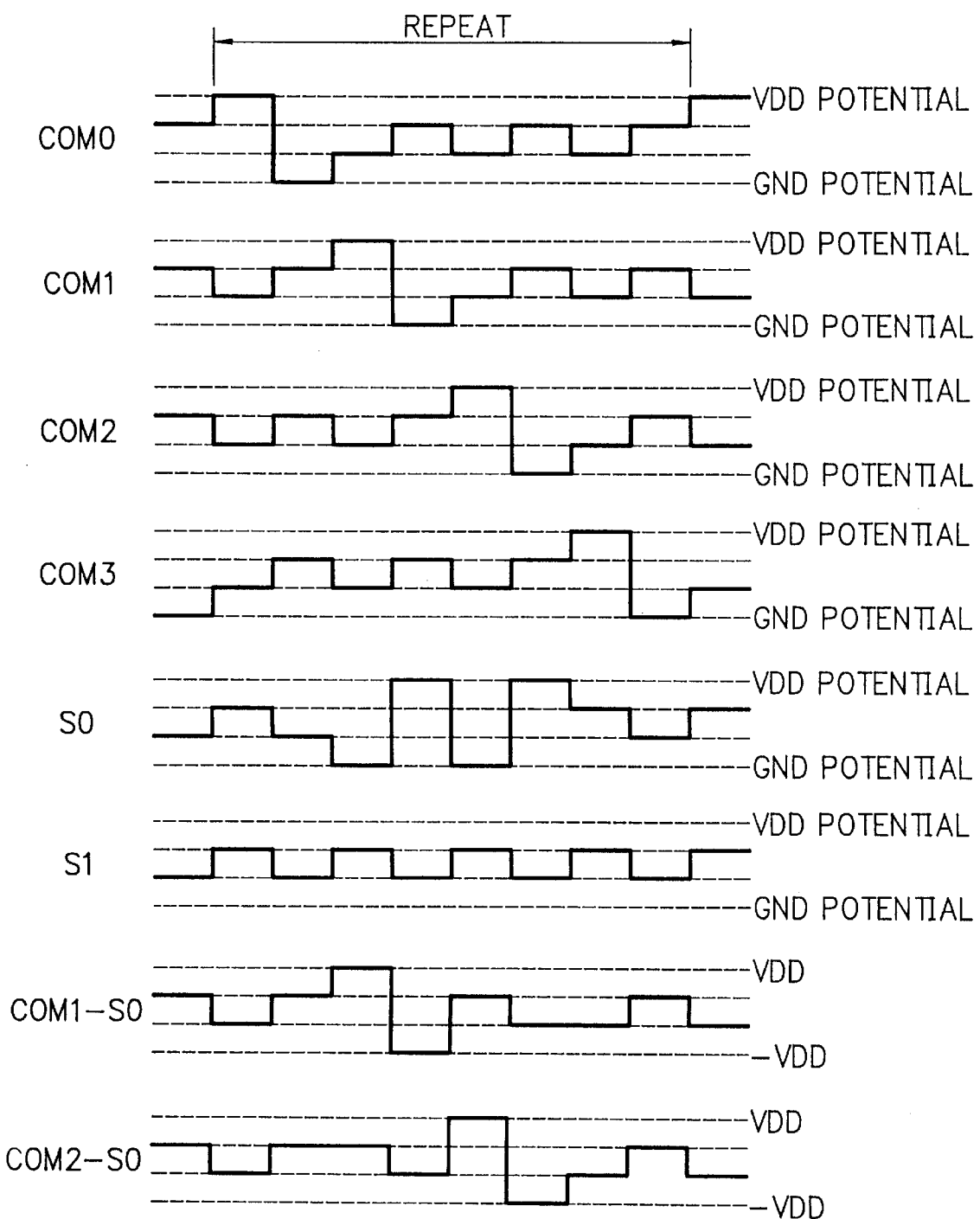
FIG. 5 is a time chart showing drive signals given to an LCD electrode.
Figure 6:
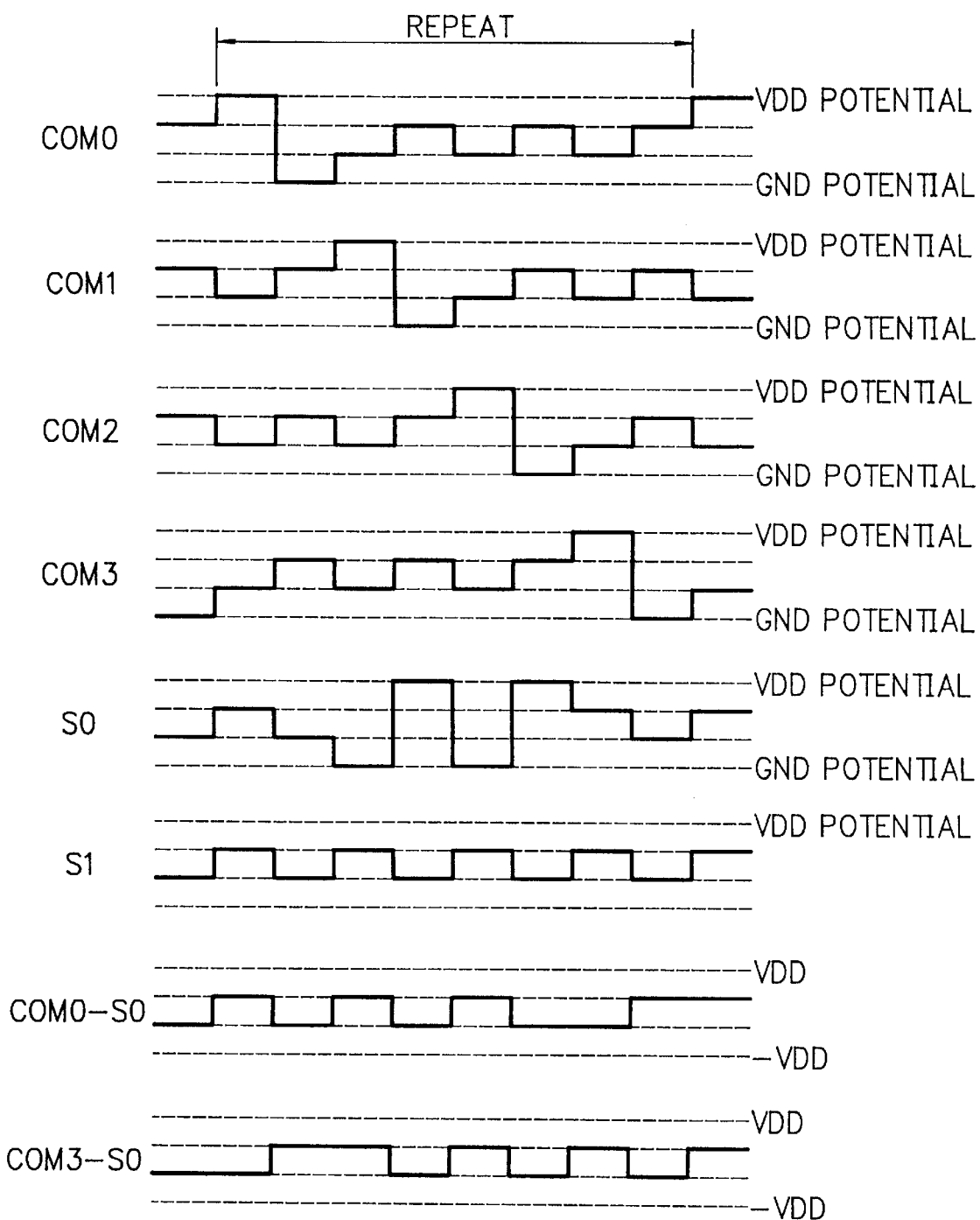
FIG. 6 is another time chart showing other drive signals given to the LCD electrode.
Figure 8:
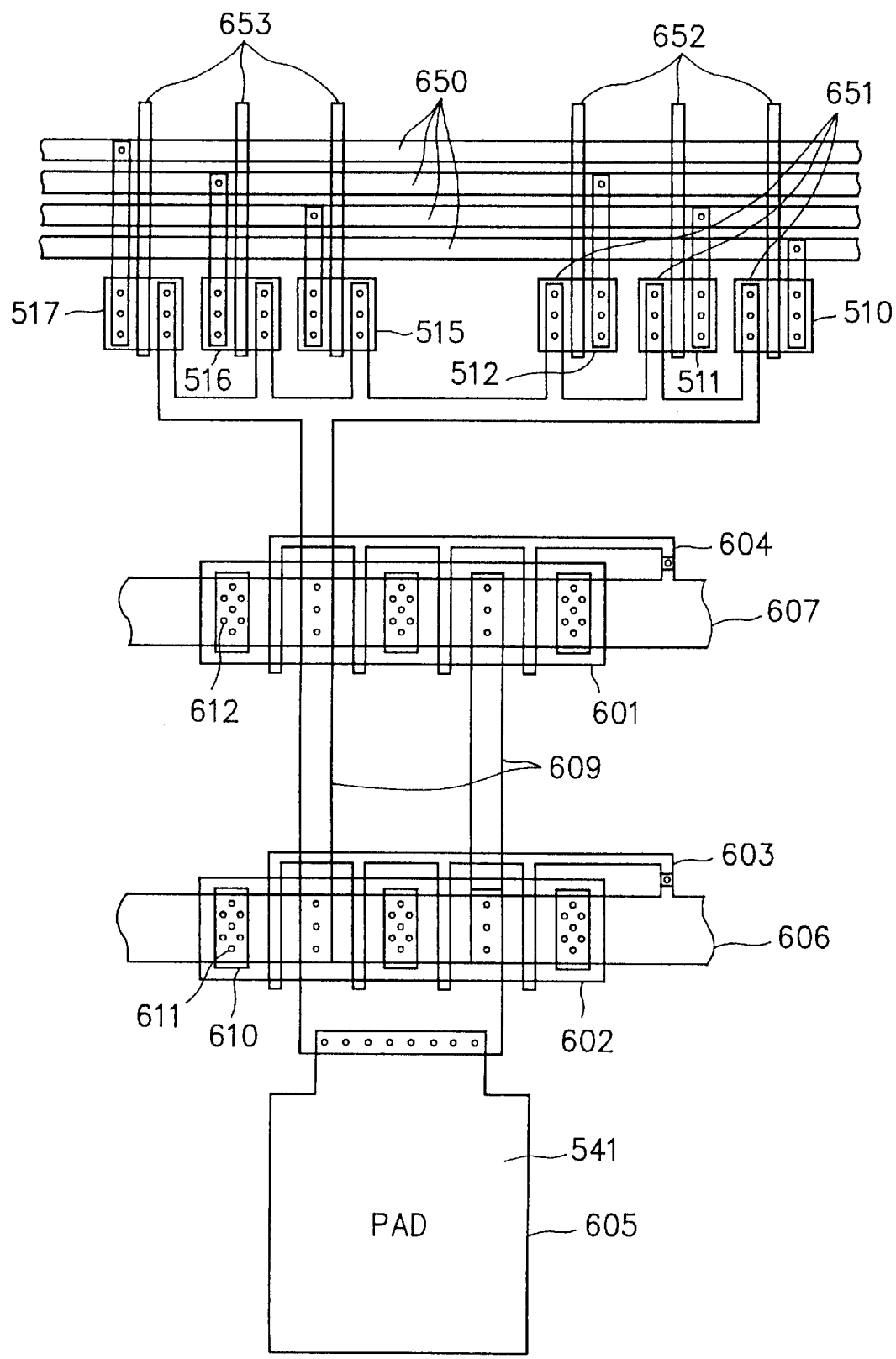
FIG. 8 is a schematic diagram of the detailed layout and wiring of the LCD drive terminals shown in FIG. 7.
Figure 9:
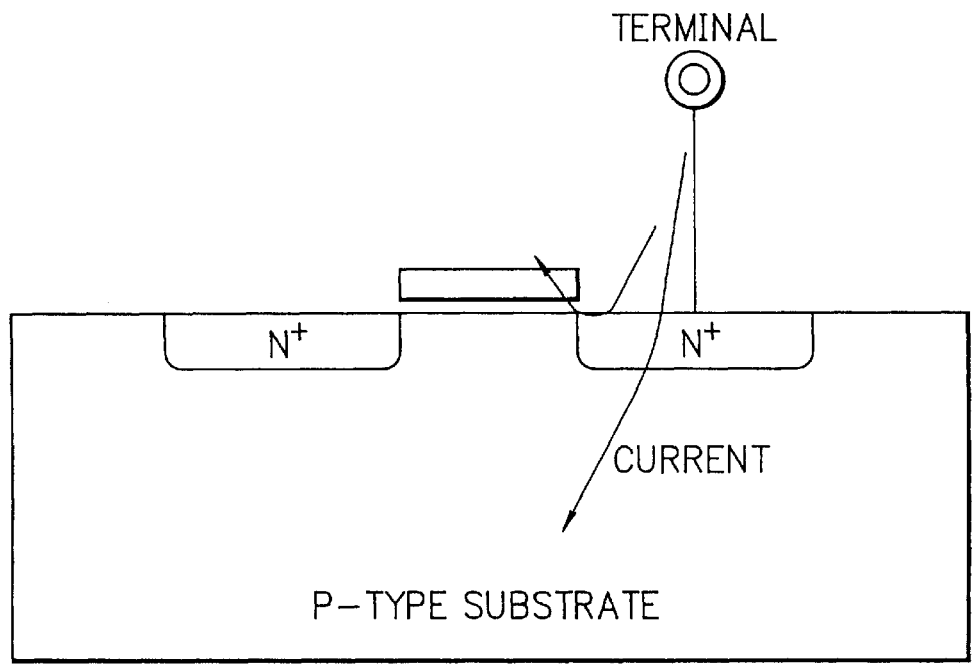
FIG. 9 is a schematic cross section showing a current flow when high static electricity is applied to the input-output terminal in a conventional semiconductor device.
Figure 10:
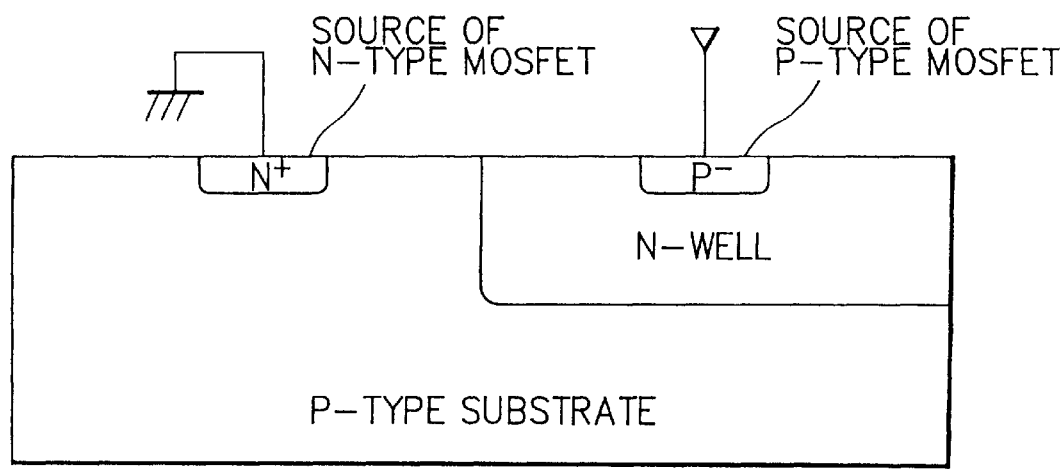
FIG. 10 is a schematic cross section of a parasitic thyristor of a conventional CMOS type IC.
Figure 11:
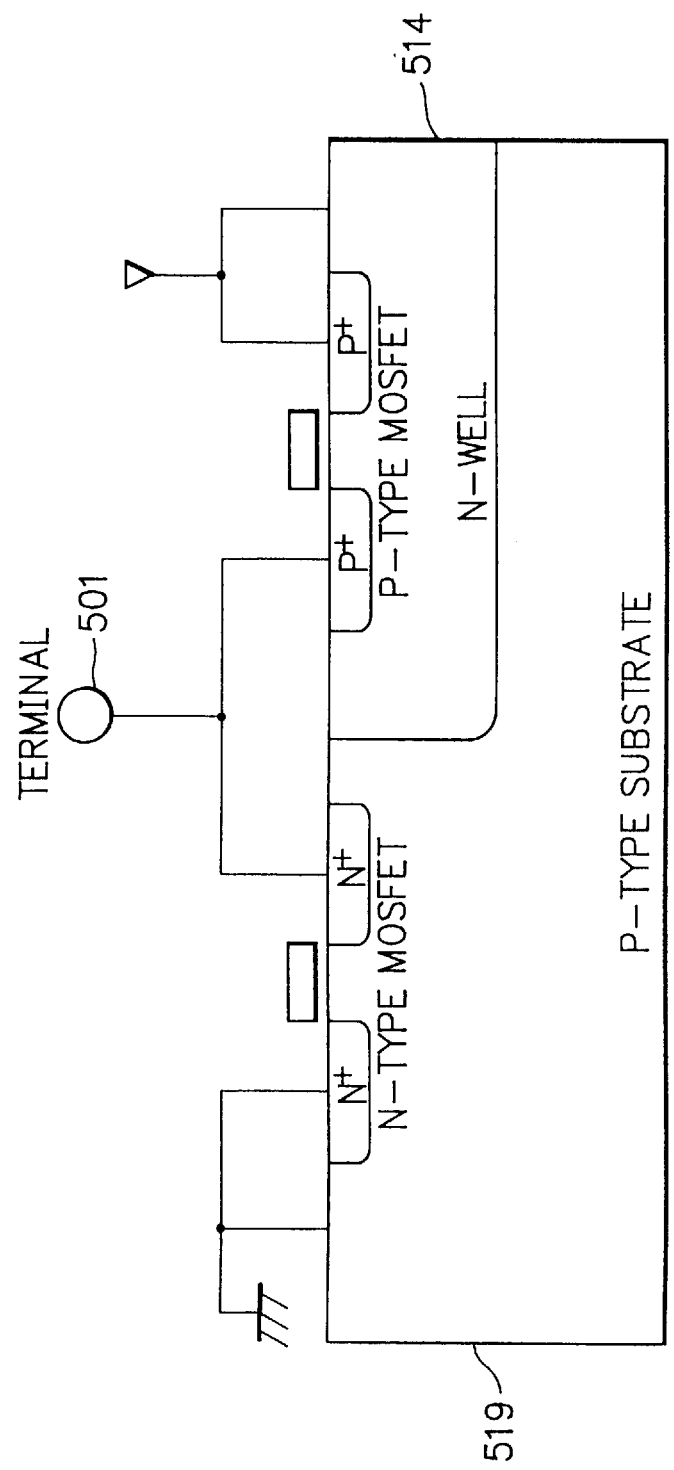
FIG. 11 is a schematic cross section showing a connection of an input-output terminal to two MOSFETs in a conventional CMOS type IC.

FIG. 12 schematically shows a layout of P-type MOSFETs 510 to 512 and 514 and N-type MOSFETs 515 to 517 and 519 connected to an input-output terminal 501, which are the same MOSFETs as those shown in FIG. 1.

In FIG. 12, the P-type MOSFETs 511 and 512 whose sources are not directly connected to the electric source, and the N-type MOSFETs 515 and 516 whose sources are not directly coupled to the ground are arranged between the P-type MOSFET 514 and the N-type MOSFET 519.

Figure 13:
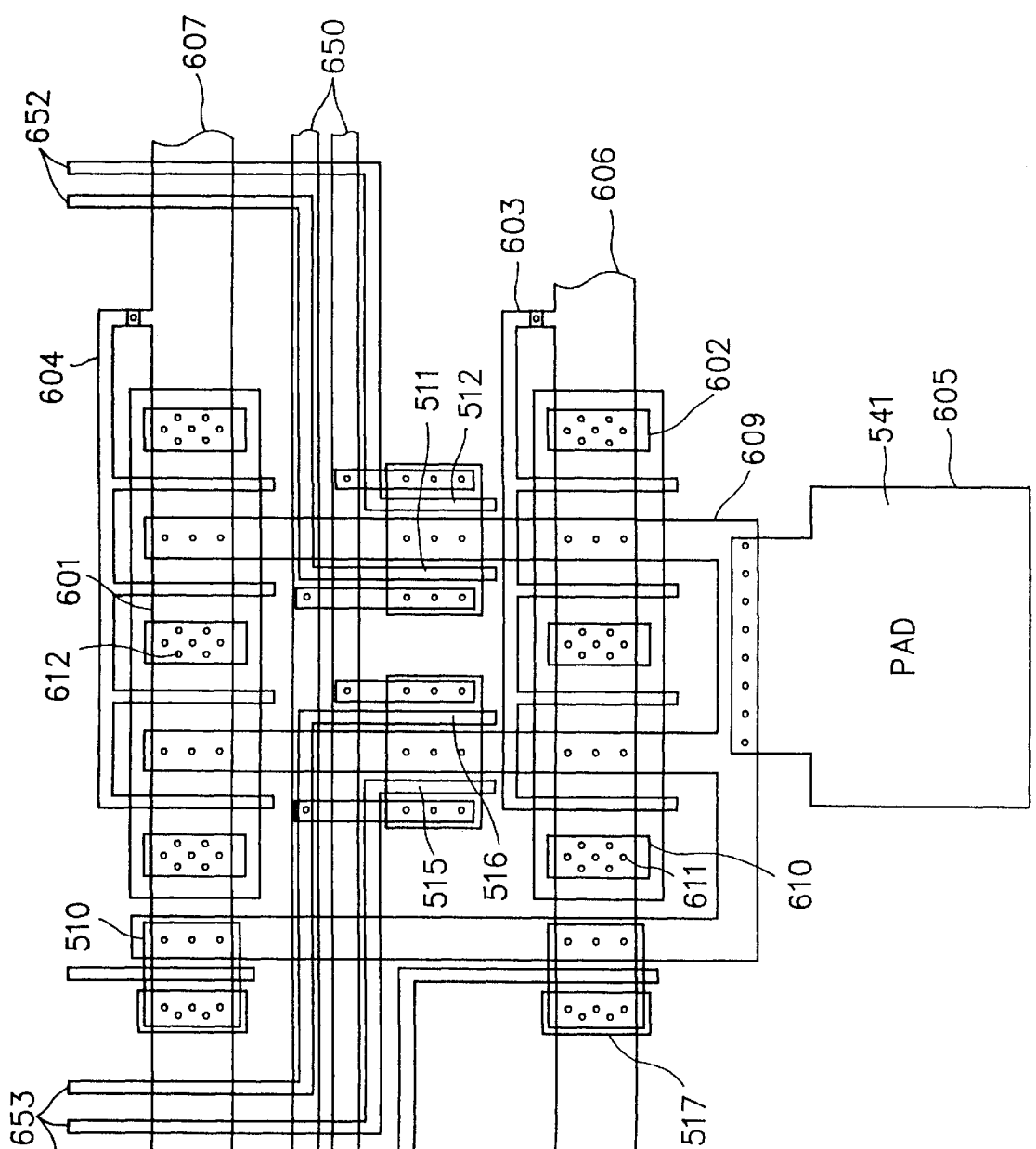
FIG. 13 is a schematic diagram of a detailed layout of the MOSFETs shown in FIG. 12.

FIG. 13 shows a detailed layout of the MOSFETs shown in FIG. 12. In FIG. 13, a P-type diffusion layer 601 provides the source and the drain of the P-type MOSFET 514, and polysilicon 604 provides the gate of the same. A second aluminum (A1) 607 is a wire for supplying a source potential to the source and the gate of the P-type MOSFET 514.

An N-type diffusion layer 602 provides the source and the drain of the N-type MOSFET 519, and a polysilicon 603 provides the gate of the same. Another second aluminum 606 is a wire for supplying a ground potential to the source of the N-type MOSFET 519.

Similar to the conventional example described above, a first aluminum 609 couples the drains of the P-type MOSFET 514 and the N-type MOSFET 519, the drains of the P-type MOSFETs 510 to 512 and the drains of the N-type MOSFETs 515 to 517 to a pad 541 corresponding to the input-output terminal 501.

In general, for operating the LCD, only the voltages of the electrodes of the LCD are changed and a steady current is not required. A small size MOSFET is sufficient for driving the LCD. In this embodiment, the P-type MOSFETs 511 and 512 and the N-type MOSFETs 515 and 516 are small-sized, and the drains of the P-type MOSFETs 511 and 512 and the drains of the N-type MOSFETs 515 and 516 have respective diffusion layers and contacts in common.

In this embodiment, the drive terminal circuit has the same construction as that of the conventional one shown in FIG. 1. The display operation of the LCD is the same as that of the conventional example described above and thus the description thereof can be omitted for brevity.

The P-type MOSFET 514 and the N-type MOSFET 519 act as protective elements against electrostatic destruction in the same manner as those of the conventional example described above.

As described above, in the diffusion layers coupled to the input-output terminal, latch-up can occur. In FIG. 12, for example, the P-type MOSFET 511 and the N-type MOSFET 519 are positioned close to each other and there is a possibility of occurrence of the latch-up.

Figure 14:
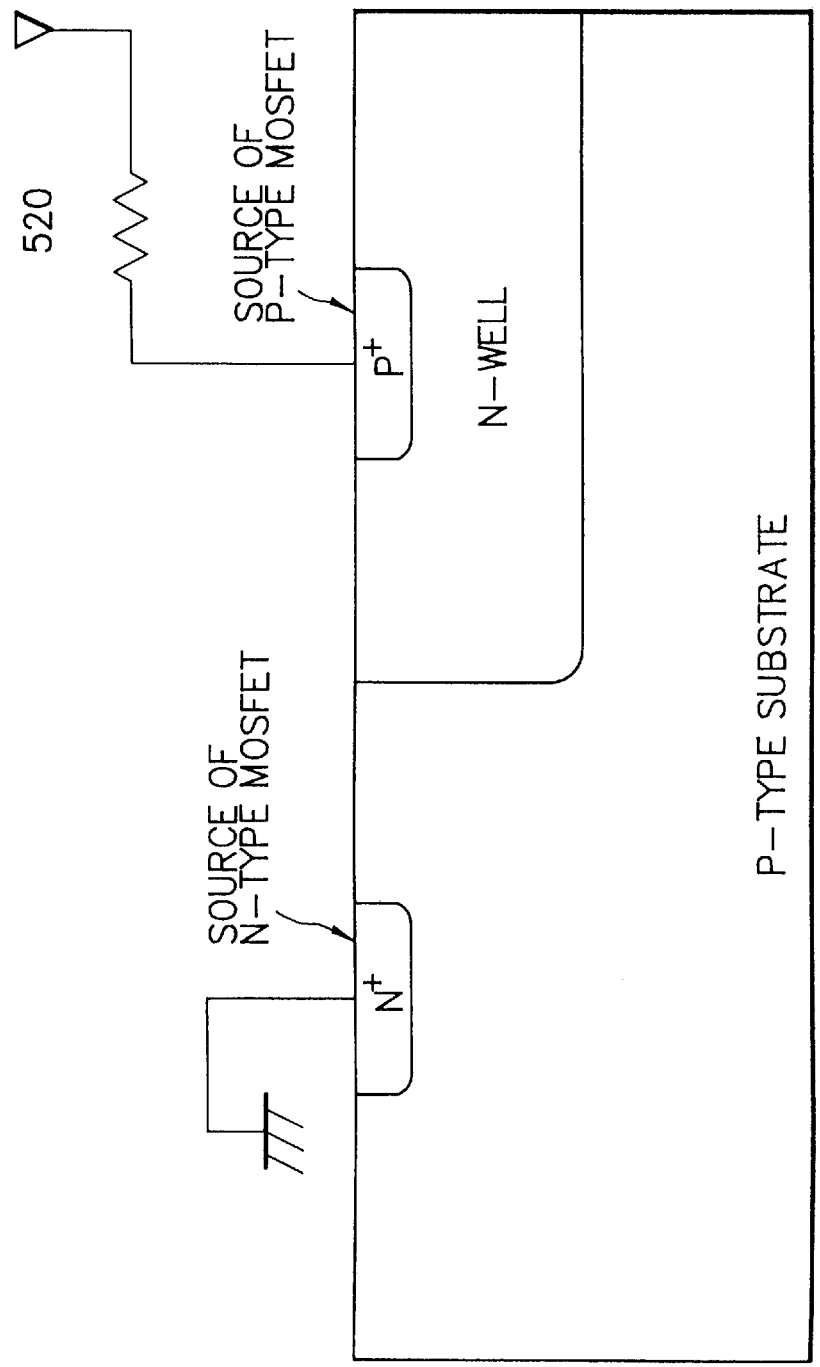
FIG. 14 is a cross section of a thyristor in an LCD drive section of the CMOS semiconductor device shown in FIG. 12 and 13.

However, in this part, as shown in FIG. 14, a resistor 520 is inserted on the source side of the P-type MOSFET 511. In general, for instance, a high value resistor of approximately 100 k Ω is used as a voltage-dividing resistor 520 shown in FIG. 1 in order to produce the required voltage for displaying the LCD.

By using this voltage-dividing resistor, a thyristor shown in FIG. 14 cannot be changed to be conductive by applying a usual VDD voltage of approximately 5 V. That is, in this embodiment, the possibility of the latch-up occurrence cannot be increased.

This is equal to the relation between the P-type MOSFET 512 and the N-type MOSFET 519 shown in FIG. 12, and similarly, the relation between the N-type MOSFET 515 and the P-type MOSFET 514 and the relation between the N-type MOSFET 516 and the P-type MOSFET 514 as well, except that the relation between the P-type and the N-type of the diffusion layers and the relation between the VDD potential and the ground potential are inverted.

That is, in this embodiment, the MOSFETs whose sources are not connected to the electric source nor the ground are arranged between the two protective diffusion layers having different polarities, to which the input-output terminal is coupled. As a result, the chip area of the semiconductor device can be effectively used and the production cost can be reduced.

As described above, according to the present invention, chip size reduction and cost reduction can be realized without damaging the resistance against electrostatic destruction and the resistance against latch-up.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor device, comprising:
    an N-type MOSFET having a drain is connected to an external input-output terminal and having a gate and source connected to a ground;
    a P-type MOSFET having a drain connected to the external input-output terminal and having a gate and source connected to an electric source; and
    at least one MOSFET having a source and drain connected to neither the electric source nor the ground, arranged between the N-type MOSFET and the P-type MOSFET.

2. A semiconductor device of claim 1, wherein the MOSFET having a source connected to neither the electric source nor the ground is selectively arranged between the N-type MOSFET and the P-type MOSFET to constitute a terminal circuit for supplying a drive signal to a liquid crystal display.

3. A semiconductor device for providing a variable output at an output terminal, comprising:
    a logic network for producing the variable output at the output terminal;
    a first protective diffusion layer having a first conductivity type for diffusing a static charge applied to the output terminal; and
    a second protective diffusion layer having a second conductivity type different from the first conductivity type for diffusing a static charge applied to the output terminal of the device,
    at least one MOSFET of the logic network for producing the variable output being arranged between the first protective diffusion layer and the second protective diffusion layer, the at least one MOSFET having no direct connection to an electric source and having no direct connection to ground.

4. A semiconductor device of claim 2, further comprising a resistor disposed between the at least one MOSFET and the liquid crystal display for providing a voltage divider for supplying an appropriate voltage for the drive signal output to the liquid crystal display.

5. The semiconductor device as recited in claim 3, wherein said at least one MOSFET arranged between said first protective diffusion layer and said second protective diffusion layer further has no direct connection to the output terminal.

* * * * *